(12) United States Patent
Chen

(10) Patent No.: US 11,079,611 B2
(45) Date of Patent: Aug. 3, 2021

(54) OPTICAL MODULE FOR PROTECTING HUMAN EYES

(71) Applicant: Edison Opto Corporation, New Taipei (TW)

(72) Inventor: Tsung-Ching Chen, JiangSu (CN)

(73) Assignee: Edison Opto Corporation, New Taipei (TW)

( * ) Notice: Subject to any disclaimer, the term of this patent is extended or adjusted under 35 U.S.C. 154(b) by 231 days.

(21) Appl. No.: 16/293,671

(22) Filed: Mar. 6, 2019

(65) Prior Publication Data

US 2019/0278104 A1    Sep. 12, 2019

(30) Foreign Application Priority Data

| Mar. 6, 2018 | (TW) | 107202928 |
| Oct. 9, 2018 | (TW) | 107213704 |
| Nov. 22, 2018 | (TW) | 107215881 |
| Jan. 14, 2019 | (TW) | 108200645 |

(51) Int. Cl.
| *G02C 7/02* | (2006.01) |
| *H01L 33/58* | (2010.01) |
| *G02B 27/09* | (2006.01) |
| *H01L 33/62* | (2010.01) |
| *H01L 27/14* | (2006.01) |
| *H01L 27/146* | (2006.01) |
| *G02B 7/02* | (2021.01) |

(52) U.S. Cl.
CPC ............ *G02C 7/02* (2013.01); *G02B 27/0955* (2013.01); *H01L 27/14* (2013.01); *H01L 27/14625* (2013.01); *H01L 33/58* (2013.01); *H01L 33/62* (2013.01); *G02B 7/02* (2013.01); *G02B 2207/121* (2013.01)

(58) Field of Classification Search
CPC .............. G02C 7/02; G02B 27/0955; G02B 2207/121; G02B 7/02; H01L 27/14625; H01L 27/14; H01L 33/58; H01L 33/62; H01S 5/06825; H01S 5/02288; H01S 5/02276; H01S 5/02296; H04M 1/0202
USPC .................... 351/159.74, 159.73, 159.01, 41
See application file for complete search history.

(56) References Cited

U.S. PATENT DOCUMENTS

| 7,928,458 B2* | 4/2011 | Lin | H01L 33/507 257/98 |
| 7,932,529 B2* | 4/2011 | Lin | H01L 33/507 257/98 |
| 2015/0129912 A1* | 5/2015 | Wang | H01L 33/58 257/98 |

* cited by examiner

*Primary Examiner* — Tuyen Tra
(74) *Attorney, Agent, or Firm* — CKC & Partners Co., LLC

(57) ABSTRACT

An optical module for protecting human eyes includes a first support element, first conductive paths, a lens, at least one second conductive path, and a light-emitting element. The first support element has a bottom plate and a sidewall on the bottom plate. The first conductive paths are in the first support element or outside the first support element. Each of the first conductive paths has a first end adjacent to a top surface of the sidewall and a second end adjacent to the bottom plate. The lens is located on the top surface of the sidewall. The second conductive path is electrically connected to the first ends of the first conductive paths. The light-emitting element is located on the bottom plate of the first support element. When a resistance difference is detected through the first and second conductive paths, the light-emitting element is switched off.

12 Claims, 16 Drawing Sheets

OPTICAL MODULE FOR PROTECTING HUMAN EYES

RELATED APPLICATIONS

This application claims priority to Taiwan Application Serial Number 107202928, filed Mar. 06, 2018, Taiwan Application Serial Number 107213704, filed Oct. 09, 2018, Taiwan Application Serial Number 107215881, filed Nov. 22, 2018, and Taiwan Application Serial Number 108200645, filed Jan. 14, 2019 all of which are herein incorporated by reference.

BACKGROUND

Field of Invention

The present disclosure relates to an optical module for protecting human eyes.

Description of Related Art

Due to the prevalence of smart phones, the functions of mobile phones are increasing. For example, optical components used in a mobile phone are becoming more and more diverse. Besides a photographic lens, the mobile phone may have a laser optical module for measuring distance or face detection.

However, when the mobile phone is hit by an external force or other factors to damage the lens of its laser optical module, because there is no power-off mechanism, it may cause laser light to directly enter human eyes, which may cause injury to human eyes.

SUMMARY

An aspect of the present disclosure is to provide an optical module for protecting human eyes.

According to an embodiment of the present disclosure, an optical module for protecting human eyes includes a first support element, first conductive paths, a lens, at least one second conductive path, and a light-emitting element. The first support element has a bottom plate and a sidewall on the bottom plate, and an accommodating space is surrounded by the sidewall. The first conductive paths are in the first support element or outside the first support element. Each of the first conductive paths has a first end and a second end, the first end is adjacent to a top surface of the sidewall, and the second end is adjacent to the bottom plate. The lens above the accommodating space and is located on the top surface of the sidewall. The second conductive path is on the lens and electrically connected to the first ends of the first conductive paths. The light-emitting element is located on the bottom plate of the first support element. When a resistance difference is detected through the first and second conductive paths, the light-emitting element is switched off.

In the aforementioned embodiments of the present disclosure, the second conductive path on the lens is electrically connected to the first conductive paths, and the second conductive path itself may serve as a resistance. Therefore, when the lens is hit by an external force or other factors to be broken or separated from the first support element, a resistance difference may be detected through the first and second conductive paths, and the light-emitting element is then switched off. As a result, the optical module can prevent the light of the light-emitting element from directly entering human eyes, thereby preventing injury to human eyes.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference made to the accompanying drawings as follows.

DETAILED DESCRIPTION

Figure 1:
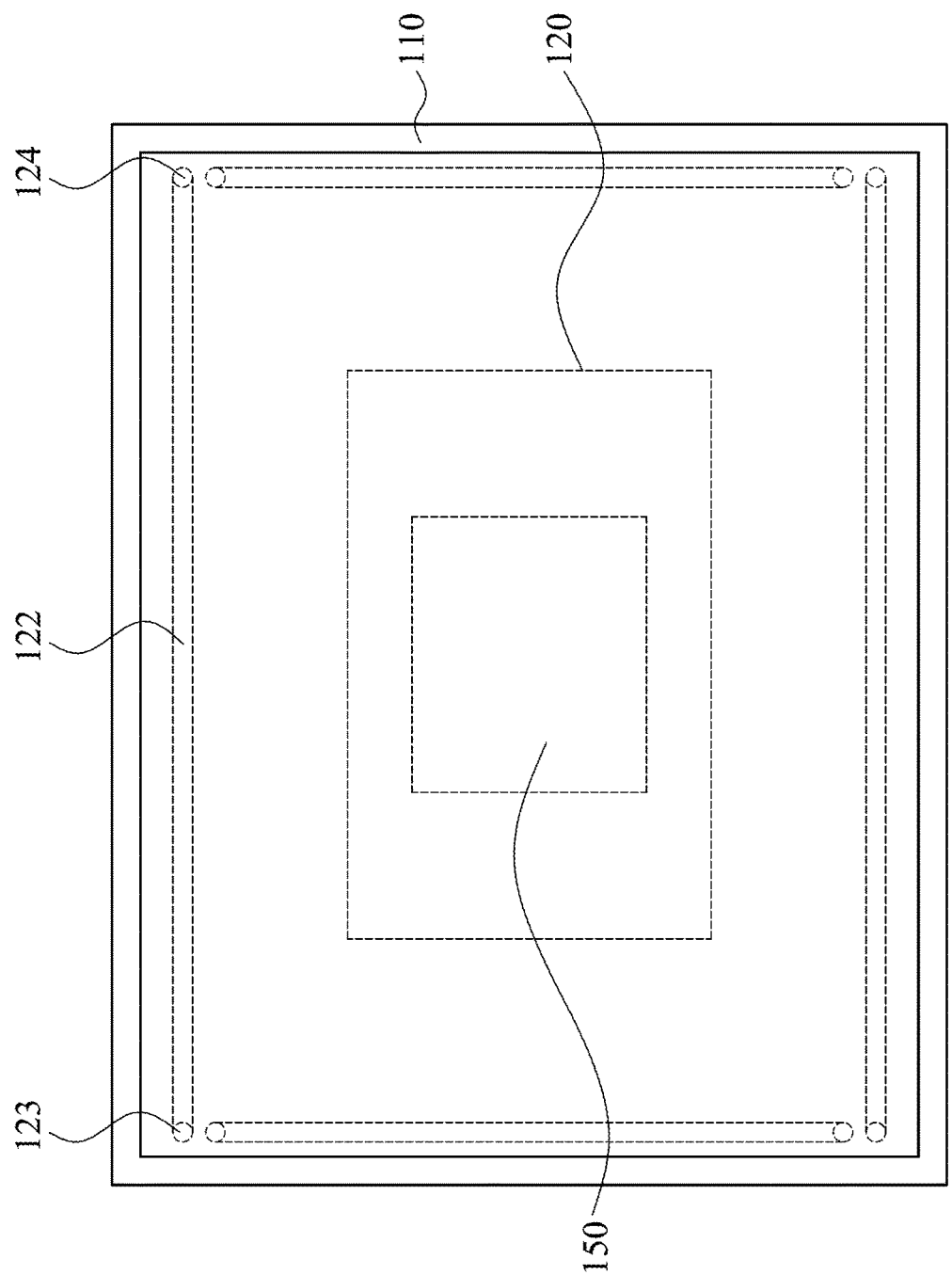
FIG. 1 is a top view of an optical module for protecting human eyes according to one embodiment of the present disclosure.

Reference will now be made in detail to the present embodiments of the invention, examples of which are illustrated in the accompanying drawings. Wherever possible, the same reference numbers are used in the drawings and the description to refer to the same or like parts.

Figure 2:
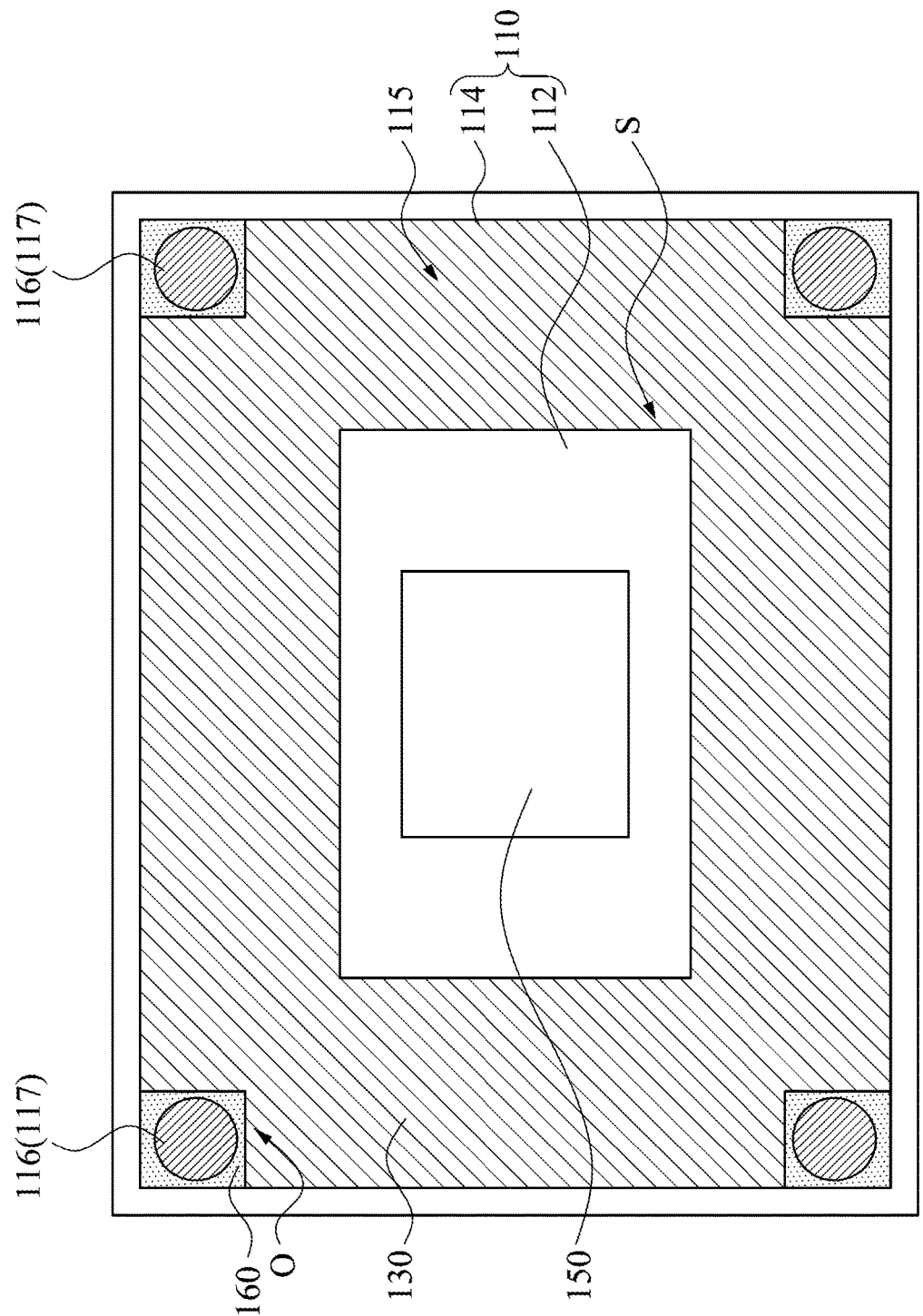
FIG. 2 is a top view of the optical module for protecting human eyes shown in FIG. 1 when a lens is removed.

FIG. 1 is a top view of an optical module 100 for protecting human eyes according to one embodiment of the present disclosure. FIG. 2 is a top view of the optical module 100 for protecting human eyes shown in FIG. 1 when a lens 120 is removed. As shown in FIG. 1 and FIG. 2, the optical module 100 for protecting human eyes includes a first support element 110, first conductive paths 116, the lens 120, second conductive paths 122, a metal bonding layer 130, and a light-emitting element 150. The first support element 110 has a bottom plate 112 and a sidewall 114 on the bottom plate 112, and an accommodating space S is surrounded by the sidewall 114. In this embodiment, the first conductive paths 116 are in the first support element 110. The first conductive path 116 has a first end 117 adjacent to a top surface 115 of the sidewall 114. For example, the first end 117 of the first conductive path 116 is on top surface 115 of the sidewall 114. The metal bonding layer 130 on the top surface 115 of the sidewall 114, and has openings O. The first end 117 of the first conductive path 116 is located in the opening O of the metal bonding layer 130. In other words, when the lens 120 is removed, the first end 117 of the first conductive path 116 is exposed. When the lens 120 is assembled onto the first support element 110, the lens 120 is located on the metal bonding layer 130, and is electrically connected to first end 117 of the first conductive path 116. The metal bonding layer 130 is between the top surface 115 of the sidewall 114 and the lens 120. Positions of the openings O of the metal bonding layer 130 are respectively correspond to positions of the first ends 117 of the first conductive paths 116. In addition, the light-emitting element 150 is located on the bottom plate 112 of the first support element 110.

The optical module 100 for protecting human eyes may be used as a measuring distance component or a face detection component of an electronic device. The light-emitting element 150 may be a laser light-emitting element, such as a laser light-emitting diode (LED), but the present disclosure is not limited in this regard.

Figure 3:
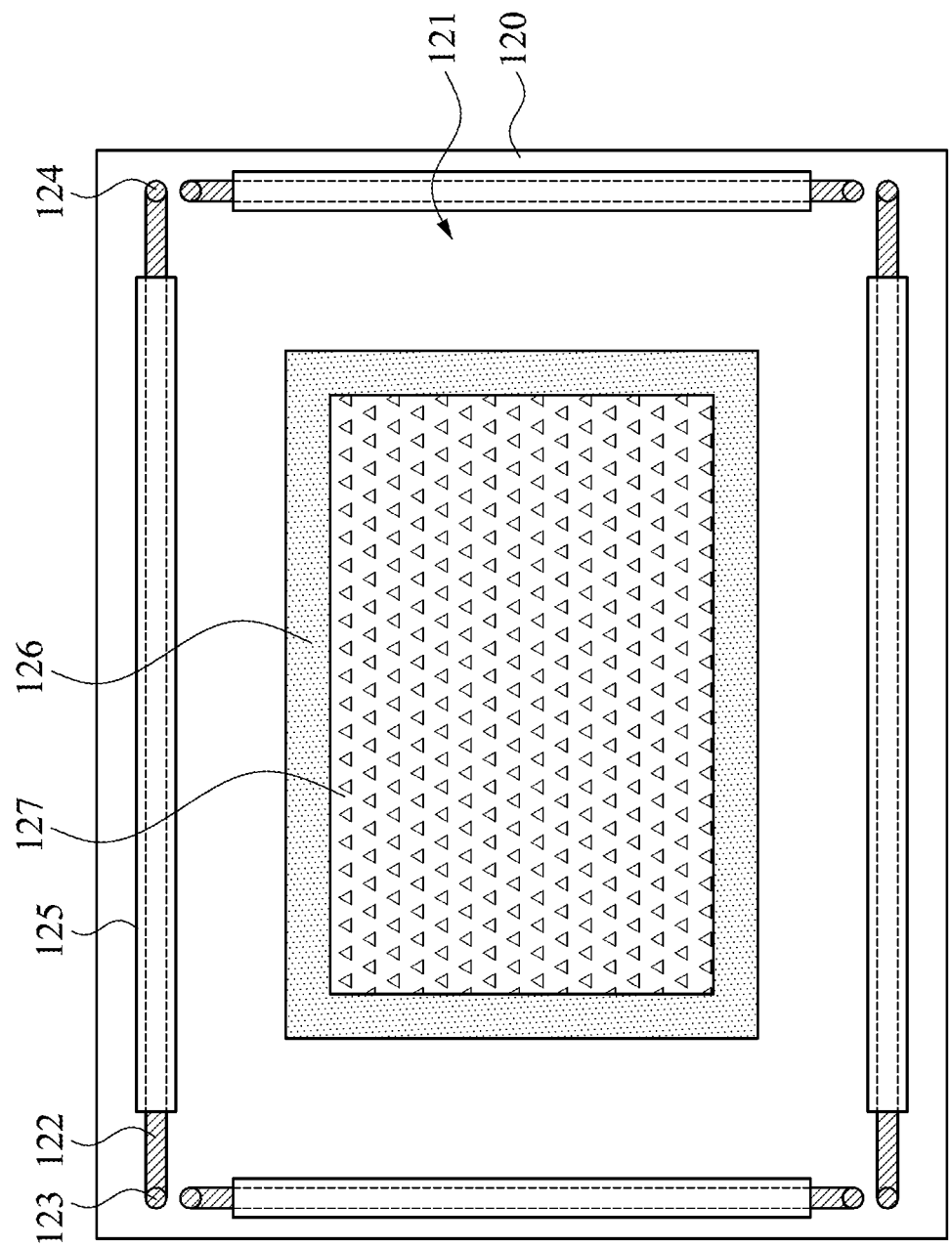
FIG. 3 is a bottom view of the lens shown in FIG. 1.

FIG. 3 is a bottom view of the lens 120 shown in FIG. 1. As shown in FIG. 2 and FIG. 3, the second conductive paths 122 are located on the lens 120, and the combination of the lens 120 and the second conductive paths 122 is referred to as a conductive lens. The second conductive paths 122 are disposed along the sidewall 114 to surround the accommodating space S. When the lens 120 is assembled onto the first support element 110, two ends 123 and 124 of the second conductive path 122 are respectively electrically connected to two first ends 117 of two first conductive paths 116. That is to say, the two ends 123 and 124 of the second conductive path 122 respectively correspond to the two first ends 117 of the two first conductive paths 116 in position, and thus the second conductive path 122 can conduct to the first conductive path 116.

Figure 4:
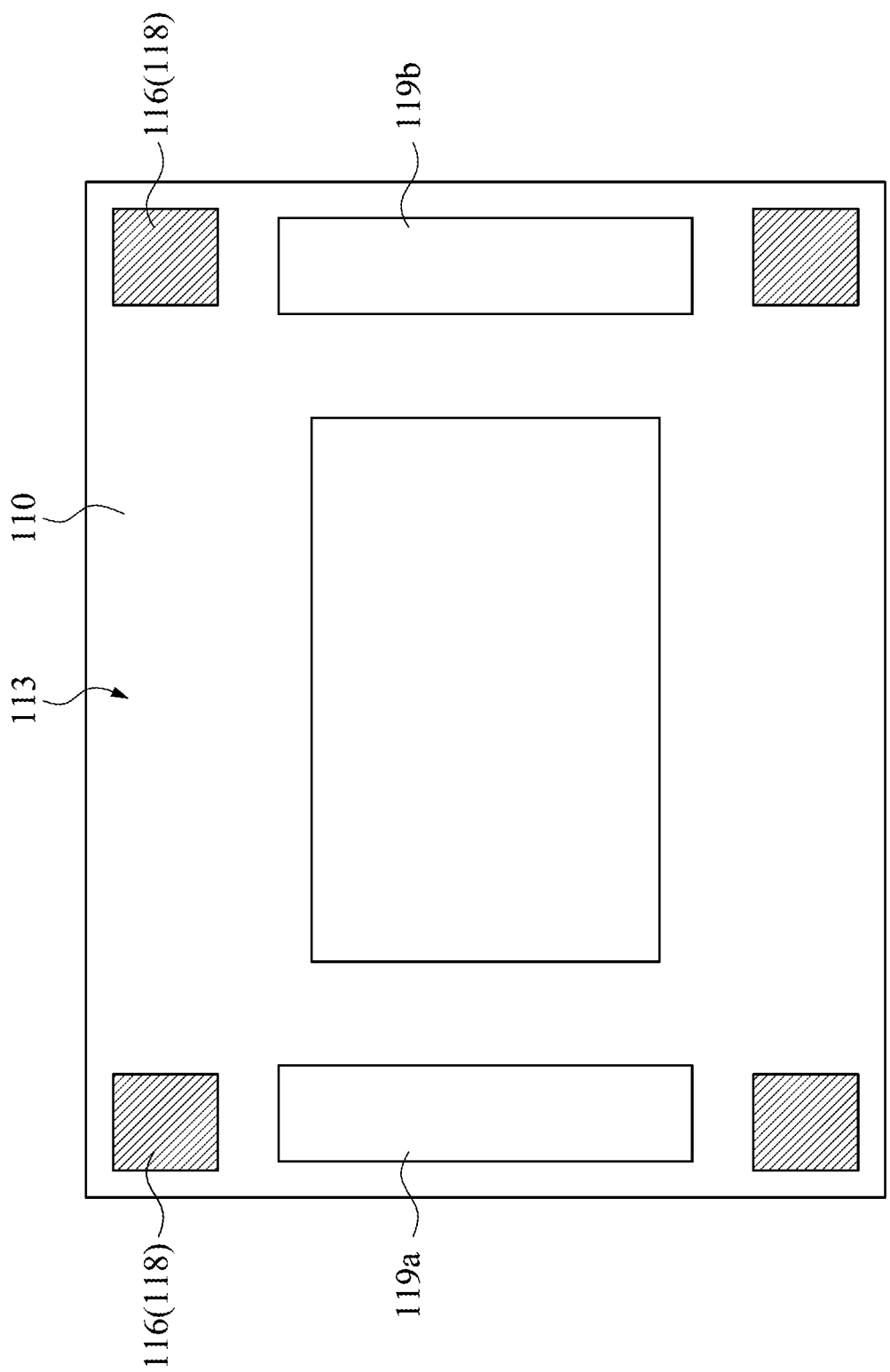
FIG. 4 is a bottom view of the optical module for protecting human eyes shown in FIG. 1.

FIG. 4 is a bottom view of the optical module 100 for protecting human eyes shown in FIG. 1. As shown in FIG. 2 and FIG. 4, the first conductive path 116 has a second end 118 opposite the first end 117 and adjacent to the bottom plate 112. The second end 118 of the first conductive path 116 is located on a bottom surface 113 of the first support element 110. Stated differently, the first conductive path 116 extends to the bottom surface 113 of the first support element 110 form the top surface 115 of the sidewall 114 of the first support element 110. Furthermore, electrodes 119a and 119b electrically connected to the light-emitting element 150 are disposed on the bottom surface 113 of the first support element 110. The electrode 119a may be an anode, and the electrode 119a may be a cathode, but the present disclosure is not limited in this regard. When the optical module 100 for protecting human eyes is used in an electronic device (e.g., a mobile phone), a sensing unit may be disposed in the electronic device to electrically connect the second end 118 of the first conductive path 116 to detect the resistance difference of the second conductive paths 122 on the lens 120 of FIG. 3.

In this embodiment, the first support element 110 may be a ceramic cup, and thus the first support element 110 has advantages of good thermal conductivity, isolation, high hardness, high melting point, etc. The first conductive path 116 may be formed through drilling a hole in the first support element 110 and filling the hole with metal. Alternatively, the first support element 110 may be formed by stacking plural ceramic layers, in which portions of the first conductive path 116 are respectively preformed in the ceramic layers. After the ceramic layers are stacked, the entire first conductive path 116 can be formed.

As shown in FIG. 2 and FIG. 3, the second conductive path 122 is electrically connected to the first conductive path 116 of the first support element 110, and the second conductive path 122 itself may serve as a resistance. Therefore, when the lens 120 is hit by an external force or other factors to be broken or separated from the first support element 110, a sensing unit may detect a resistance difference through the first and second conductive paths 116 and 122, and then sends a signal to a power unit that is electrically connected to the electrodes 119a and 119b to switch the light-emitting element 150 off. Since the light of the light-emitting element 150 passing through a broken lens or no lens has excessive energy, the light would cause injury to human eyes. Accordingly, the optical module 100 for protecting human eyes can prevent the light of the light-emitting element 150 from directly entering human eyes, thereby preventing injury to human eyes.

In this embodiment, the lens 120 may be a quadrilateral (e.g., a rectangle) when viewed from above, and thus has four sides. The number of the second conductive paths 122 is four, and the four second conductive paths 122 are respectively located on the four sides of the lens 120. The sidewall 114 of the first support element 110 is a quadrilateral when viewed from above, and thus has four sides. The number of the openings O of the metal bonding layer 130 is four, the number of the first conductive paths 116 is also four, and the four first ends 117 of the four first conductive paths 116 are respectively located on four corners of the top surface 115 of the sidewall 114. In each opening O, the first end 117 of the first conductive path 116 is electrically connected to two second conductive paths 122. As a result, whether which portion of the lens 120 is broken or separated from the first support element 110, a resistance difference may be detected through the first and second conductive paths 116 and 122. The optical module 100 for protecting human eyes utilizes eight points to detect the resistance difference of the second conductive paths 122 on the lens 120, thereby improving accuracy.

In this embodiment, the optical module 100 for protecting human eyes may further include an isolation layer 160 that is in the opening O of the metal bonding layer 130 and surrounds the first end 117 of the first conductive path 116. When the lens 120 is disposed on the metal bonding layer 130, the isolation layer 160 is located among the first end 117 of the first conductive path 116, the metal bonding layer 130, the lens 120, and the top surface 115 of the sidewall 114. The isolation layer 160 may ensure that the first end 117 of the first conductive path 116 is not directly in contact with the metal bonding layer 130, and is merely in contact with the lens 120. Moreover, the isolation layer 160 may seal the opening O of the metal bonding layer 130 to prevent moisture from entering the optical module 100 from the opening O.

In addition, an isolation layer 125 on the second conductive path 122. When the lens 120 is assembled onto the first support element 110, the isolation layer 125 is between the second conductive path 122 and the metal bonding layer 130, and the second conductive path 122 and the metal bonding layer 130 are electrically isolated from each other by the isolation layer 125. In this embodiment, although regions of the second conductive path 122 adjacent to the two ends 123 and 124 are not covered by the isolation layer 125, the regions correspond to the openings O of the metal bonding layer 130 in position. That is, the regions are merely in contact with the isolation layer 160, not in contact with the metal bonding layer 130.

The isolation layer 125 may provide protection and isolation to the second conductive path 122. The isolation layers 125 and 160 may be made of a material including silicon dioxide or silicon nitride. The second conductive path 122 may be made of a material including indium tin oxide (ITO), but the present disclosure is not limited in this regard.

Further, the lens 120 has a bottom surface 121 and a gold plating layer 126 that face toward the first support element 110. The gold plating layer 126 is located on the bottom surface 121 of the lens 120, and is in contact with the metal bonding layer 130. Therefore, the lens 120 can be fixed on the top surface 115 of the sidewall 114 of the first support element 110 through the metal bonding layer 130. Compared with traditional adhesive, the metal bonding layer 130 has good heat resistance to effectively improve the stability between the lens 120 and the first support element 110, thereby preventing the lens 120 from separating from the first support element 110 in a high temperature state. In this embodiment, the metal bonding layer 130 may be made of a material including gold-tin alloy, such as 80% gold and 20% tin. When the lens 120 is assembled onto the first support element 110, the metal bonding layer 130 may be melted using the temperature of 260° C., and the plating layer 126 of the lens 120 is then bonded to the metal bonding layer 130. During the bonding, gold in the plating layer 126 may diffuse into the metal bonding layer 130 to increase the gold content of the metal bonding layer 130, such as the metal bonding layer 130 including 90% gold and 10% tin. As a result, the melting point of the metal bonding layer 130 can increase to 400° C., and thus the stability between the lens 120 and the first support element 110 can be effectively improved in a high temperature state, thereby improving the product yield and the lifespan of the optical module 100 for protecting human eyes (see FIG. 1).

In this embodiment, the lens 120 may be a light diffusing type lens. For example, the bottom surface 121 of the lens 120 may has microstructures 127 through an etch process or an imprinting process. The lens 120 can diffuse the light (e.g., a laser) of the light-emitting element 150 out of the optical module 100 (see FIG. 1) through the microstructures 127, thereby preventing the light with excessive energy from directly irradiating human eyes to cause injury. The microstructures 127 of FIG. 3 are used as an example, and the present disclosure is not limited to the shape and the arrangement of the microstructures 127.

Figure 5:
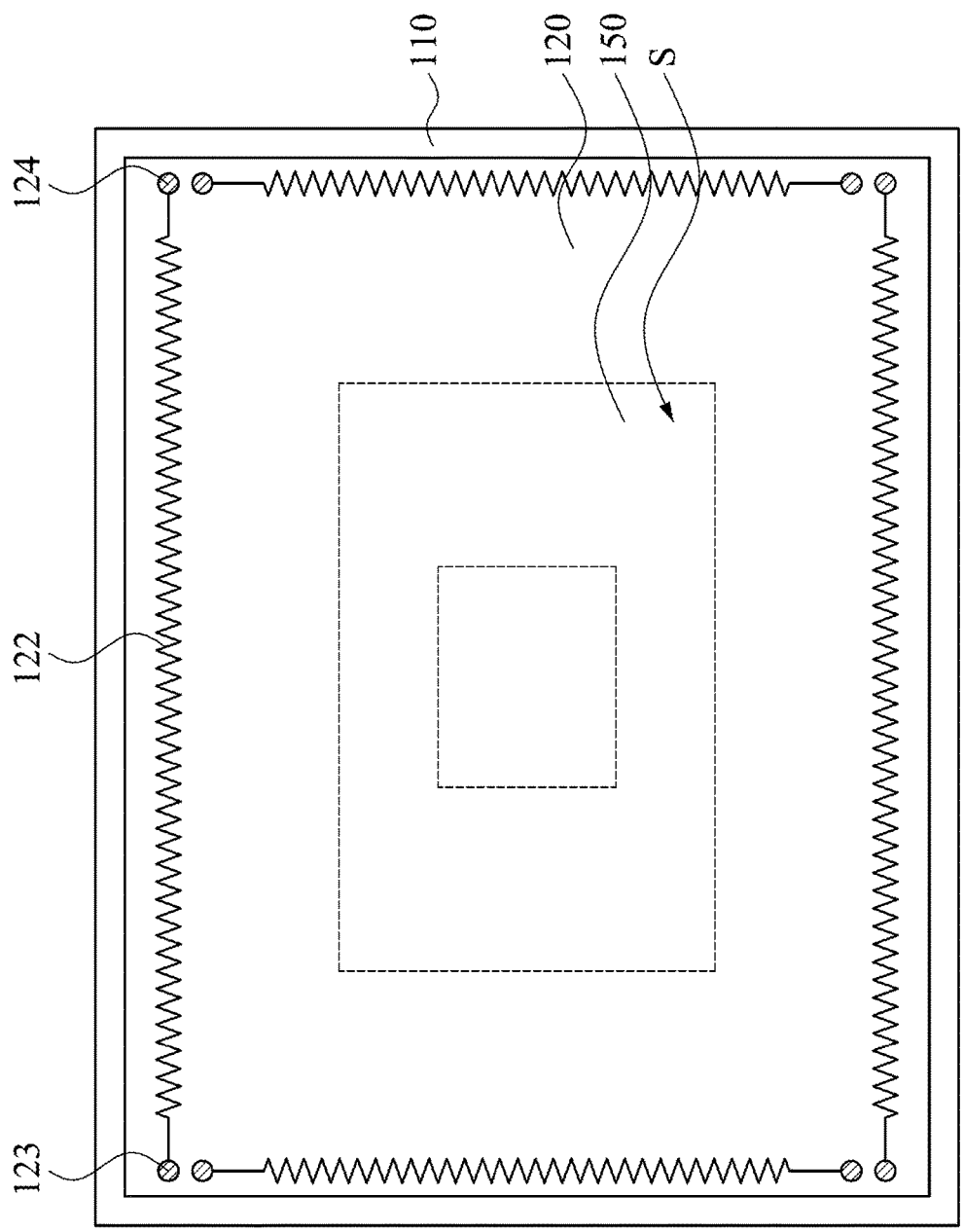
FIG. 5 is a circuit schematic diagram of the optical module for protecting human eyes shown in FIG. 1.

FIG. 5 is a circuit schematic diagram of the optical module 100 for protecting human eyes shown in FIG. 1. Since each of the second conductive paths 122 itself may be referred to as a resistance, FIG. 5 shows resistor symbols to replace the second conductive paths 122 of FIG. 3. When the lens 120 is hit by an external force or other factors to be broken or separated from the first support element 110, a resistance difference may be detected by the first and second conductive paths 116 and 122, and thus the light-emitting element 150 can be switched off.

Figure 8:
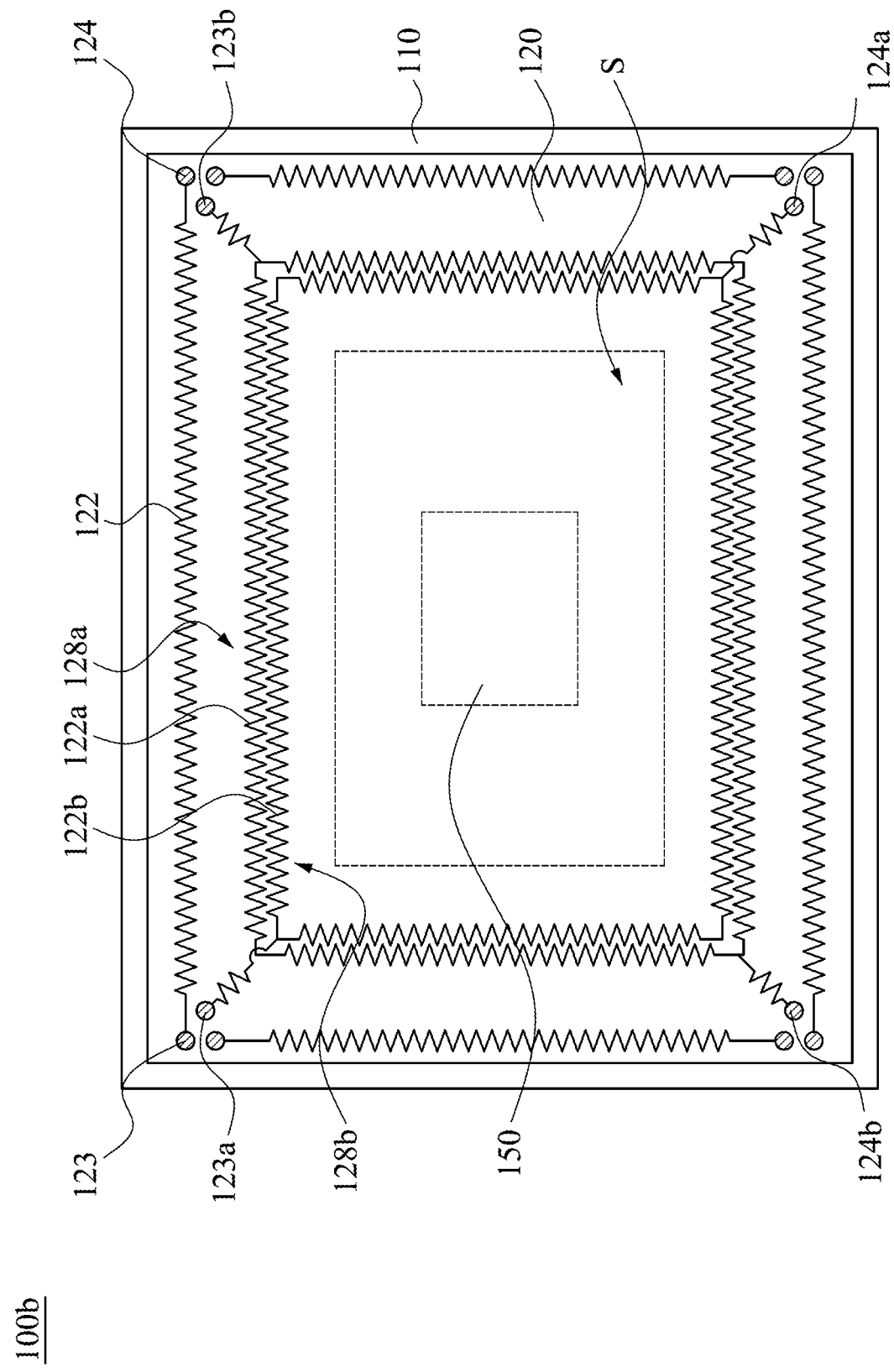
FIG. 8 is a circuit schematic diagram of an optical module for protecting human eyes according to one embodiment of the present disclosure.

It is to be noted that the connection relationships and materials of the elements described above will not be repeated in the following description. In the following description, other types of optical modules for protecting human eyes will be described. Moreover, in order to simplify the following drawings, FIG. 6 and FIG. 8 show resistor symbols to replace other types of second conductive paths.

Figure 6:
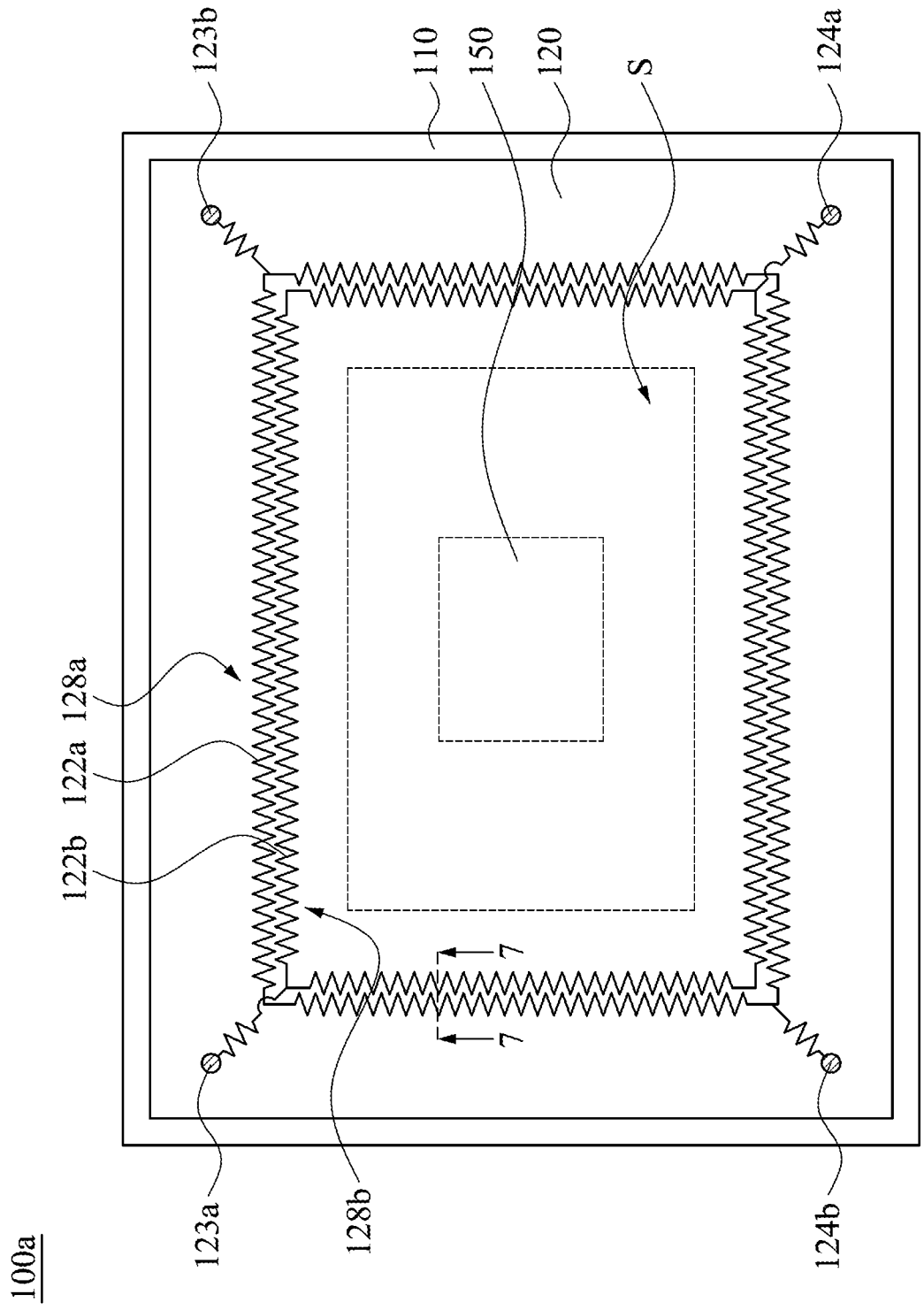
FIG. 6 is a circuit schematic diagram of an optical module for protecting human eyes according to one embodiment of the present disclosure.
Figure 7:
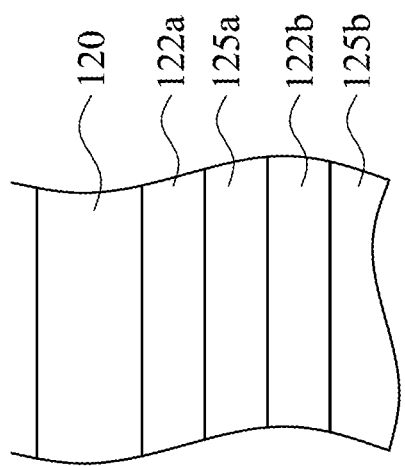
FIG. 7 is a cross-sectional view of the optical module for protecting human eyes taken along line 7-7 shown in FIG. 6.

FIG. 6 is a circuit schematic diagram of an optical module 100a for protecting human eyes according to one embodiment of the present disclosure. FIG. 7 is a cross-sectional view of the optical module 100a for protecting human eyes taken along line 7-7 shown in FIG. 6. As shown in FIG. 6 and FIG. 7, the optical module 100a for protecting human eyes includes the first support element 110, the first conductive paths 116 (see FIG. 2), the lens 120, and the light-emitting element 150. The difference between this embodiment and the embodiment shown in FIG. 5 is that the number of second conductive paths is two (i.e., second conductive paths 122a and 122b). The second conductive path 122b may be below the second conductive path 122a, and the second conductive paths 122a and 122b are electrically isolated from each other. In other words, the second conductive paths 122a and 122b are at different layers.

Furthermore, the second conductive paths 122a and 122b respectively have quadrilateral structures 128a and 128. The quadrilateral structures 128a and 128 surround the accommodating space S. Two ends 123a and 124a of the second conductive path 122a are respectively located on opposite two corners (e.g., an upper left corner and a lower right corner) of the top surface 115 of the sidewall 114 (see FIG. 2). Two ends 123b and 124b of the second conductive path 122b are respectively located on opposite two corners (e.g., an upper right corner and a lower left corner) of the top surface 115 of the sidewall 114 (see FIG. 2). In addition, as shown in FIG. 2 and FIG. 6, the number of the first conductive paths 116 is four, the four first ends 117 of the four first conductive paths 116 are respectively located on the four corners of the top surface 115 of the sidewall 114, and the two ends 123a and 124a of the second conductive path 122a and the two ends 123b and 124b of the second conductive path 122b are respectively electrically connected to the four first ends 117 of the four first conductive paths 116.

In this embodiment, the second conductive paths 122a and 122b are at different layers such that the design for conductive paths would be more flexible. Whether which corner of the lens 120 is broken or separated from the first support element 110, a resistance difference may be detected through the first conductive paths 116 and second conductive paths 122a and 122b. The optical module 100a for protecting human eyes utilizes four points to detect the resistance difference of the second conductive paths 122a and 122b on the lens 120, thereby improving accuracy.

In this embodiment, the optical module 100a for protecting human eyes further includes isolation layers 125a and 125b. The isolation layer 125a is between the two second conductive paths 122a and 122b, and the lower second conductive path 122b is between the two isolation layers 125a and 125b. The isolation layers 125a and 125b may provide protection and isolation to the second conductive paths 122a and 122b.

FIG. 8 is a circuit schematic diagram of an optical module 100b for protecting human eyes according to one embodiment of the present disclosure. The optical module 100b for protecting human eyes includes the first support element 110, the first conductive paths 116 (see FIG. 2), the lens 120, and the light-emitting element 150. The optical module 100b has the four second conductive paths 122 of FIG. 5 and the two second conductive paths 122a and 122b of FIG. 6. The second conductive paths 122a and 122b are at different layers. In one embodiment, the second conductive paths 122 and one of the second conductive paths 122a and 122b may be at the same layer. In an alternative embodiment, the second conductive paths 122, 122a, and 122b may be at the different layers. As a result, the design for conductive paths would be more flexible.

As shown in FIG. 2 and FIG. 8, in this embodiment, the number of the first conductive paths 116 is four, the four first ends 117 of the four first conductive paths 116 are respectively located on the four corners of the top surface 115 of the sidewall 114. That is, each corner has one first end 117. The two ends 123 and 124 of the second conductive path 122, the two ends 123a and 124a of the second conductive path 122a, and the two ends 123b and 124b of the second conductive path 122b are electrically connected to the four first ends 117 of the four first conductive paths 116. As a result, whether which corner of the lens 120 is broken or separated from the first support element 110, a resistance difference may be detected through the first conductive paths 116 and second conductive paths 122, 122a and 122b. The optical module 100b for protecting human eyes utilizes twelve points to detect the resistance difference of the second conductive paths 122, 122a and 122b on the lens 120, thereby improving accuracy.

Figure 9:
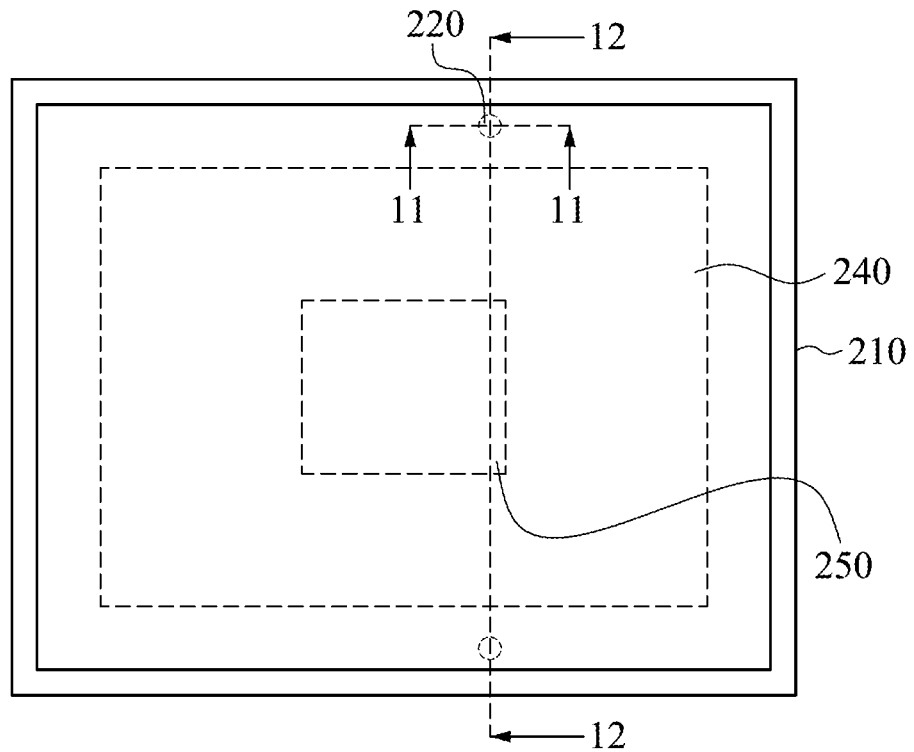
FIG. 9 is a top view of an optical module for protecting human eyes according to one embodiment of the present disclosure.
Figure 10:
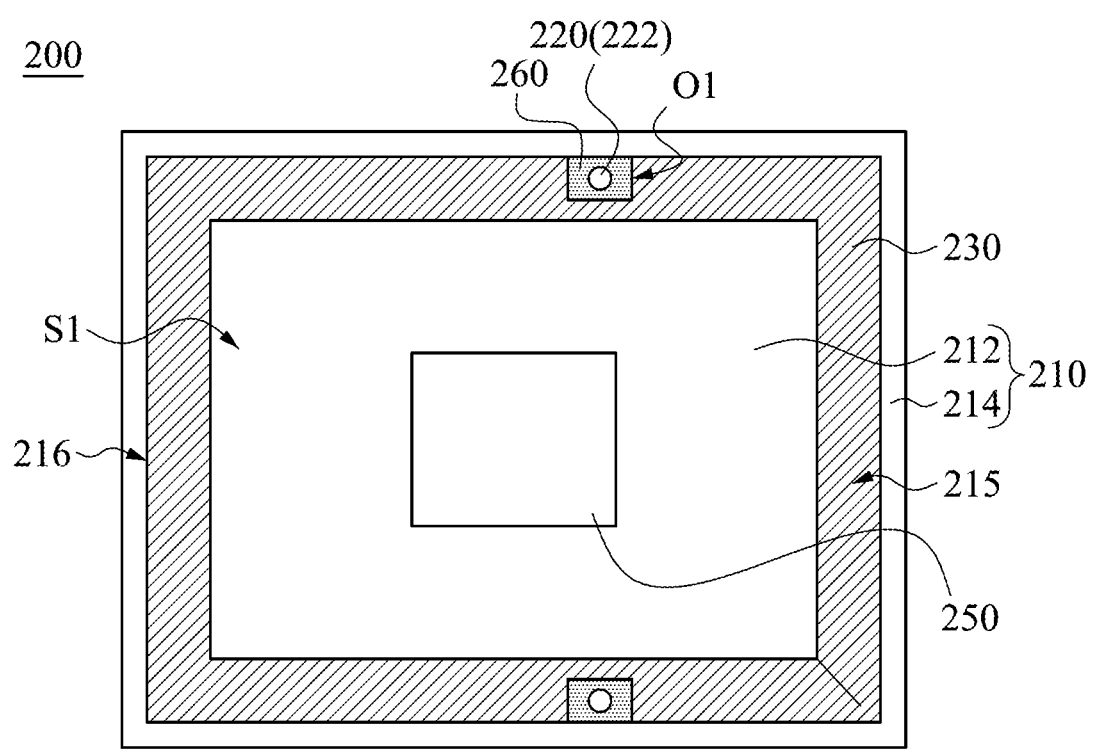
FIG. 10 is a top view of the optical module for protecting human eyes shown in FIG. 9 when a lens is removed.

FIG. 9 is a top view of an optical module 200 for protecting human eyes according to one embodiment of the present disclosure. FIG. 10 is a top view of the optical module 200 for protecting human eyes shown in FIG. 9 when a lens 240 is removed. As shown in FIG. 9 and FIG. 10, the optical module 200 includes a first support element 210, first conductive paths 220, a metal bonding layer 230, a lens 240, and a light-emitting element 250. The first support element 210 has a bottom plate 212 and a sidewall 214 that surrounds the bottom plate 212. The first conductive paths 220 are located in the first support element 210. The first conductive path 220 has a first end 222 on a top surface 215 of the sidewall 214. When the lens 240 is removed, the first ends 222 of the first conductive paths 220 are exposed. When the lens 240 is assembled onto the first support element 210, the first ends 222 of the first conductive paths 220 are covered by the lens 240 such that the first conductive paths 220 and the lens 240 are electrically connected with each other. The metal bonding layer 230 is on the top surface 215 of the sidewall 214 and has an opening O1. The first end 222 of the first conductive path 220 is located in the opening O1 of the metal bonding layer 230. The lens 240 is located on the metal bonding layer 230 and the first ends 222 of the first conductive paths 220. The light-emitting element 250 is located on the bottom plate 212 of the first support element 210.

The lens 240 can be fixed on the top surface 215 of the sidewall 214 of the first support element 210 through the metal bonding layer 230 and a gold plating layer that is on the bottom surface of the lens 240. Functions of the metal bonding layer 230 and the gold plating layer are similar to that of the aforementioned metal bonding layer 130 of FIG. 2 and the gold plating layer 126 of FIG. 3, and will not be described again.

In this embodiment, the sidewall 214 of the first support element 210 surrounds an accommodating space S1. The sidewall 214 of the first support element 210 has an inner sidewall surface 216 that faces toward the accommodating space S1. The inner sidewall surface 216 is a rectangle (e.g., a square) when viewed from above, and thus the lens 240 having a corresponding top view shape (e.g., a square) may be assemble onto the sidewall 214. However, the top view shapes of the lens 240 and the inner sidewall surface 216 of the sidewall 214 may be changed as deemed necessary by designers, and the present disclosure is not limited in this regard.

Figure 11:
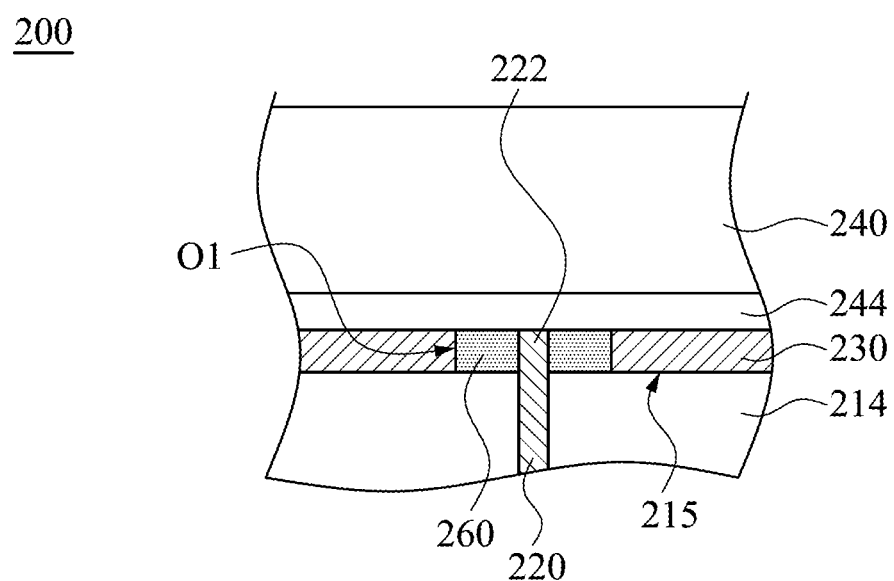
FIG. 11 is a cross-sectional view of the optical module for protecting human eyes taken along line 11-11 shown in FIG. 9.

FIG. 11 is a cross-sectional view of the optical module 200 for protecting human eyes taken along line 11-11 shown in FIG. 9. As shown in FIG. 10 and FIG. 11, the optical module 200 for protecting human eyes further includes an isolation layer 260 that is in the opening O1 of the metal bonding layer 230 and surrounds the first end 222 of the first conductive path 220. When the lens 240 is disposed on the metal bonding layer 230, the isolation layer 260 is located among the first end 222 of the first conductive path 220, the metal bonding layer 230, the lens 240, and the top surface 215 of the sidewall 214. The isolation layer 260 may ensure that the first end 222 of the first conductive path 220 is not directly in contact with the metal bonding layer 230, and is merely in contact with the lens 240. Moreover, the isolation layer 260 may seal the opening O1 of the metal bonding layer 230 to prevent moisture from entering the optical module 200 from the opening O1.

Figure 12:
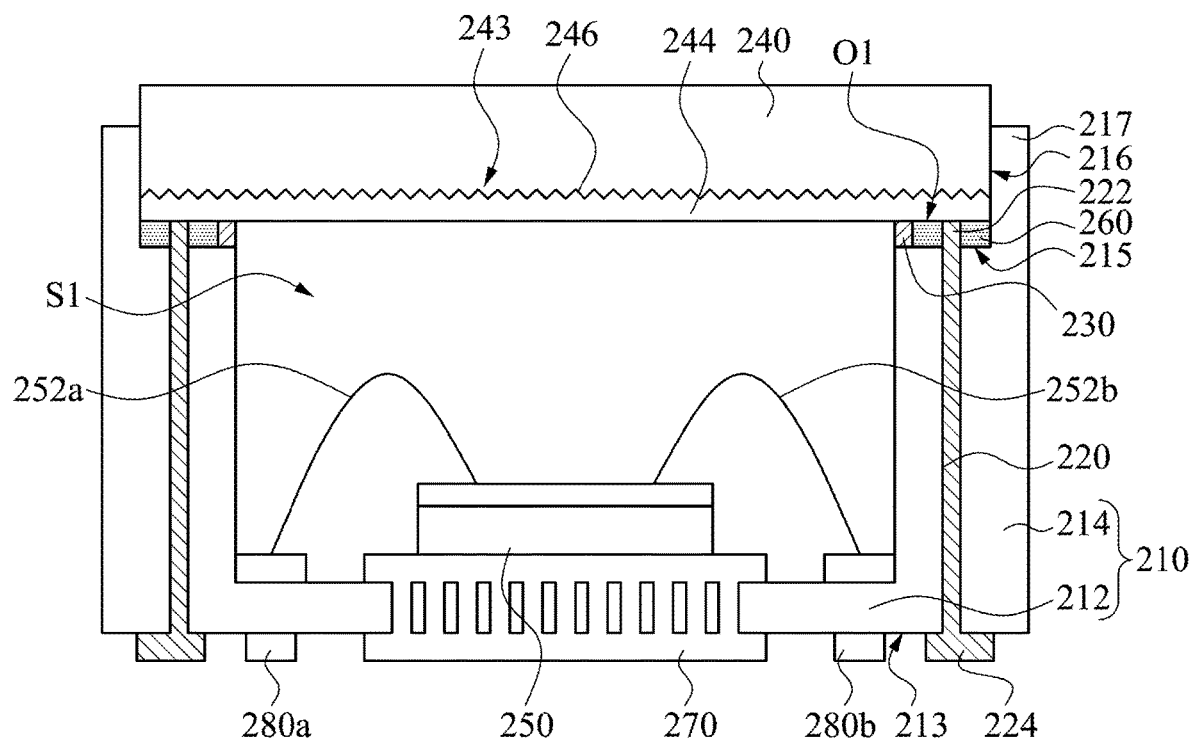
FIG. 12 is a cross-sectional view of the optical module for protecting human eyes taken along line 12-12 shown in FIG. 9.

FIG. 12 is a cross-sectional view of the optical module 200 for protecting human eyes taken along line 12-12 shown in FIG. 9. As shown in FIG. 11 and FIG. 12, since the first end 222 of the first conductive path 220 may be in the opening O1 of the metal bonding layer 230, the lens 240 can be electrically connected to the first end 222 of the first conductive path 220 when the lens 240 is disposed on the metal bonding layer 230.

The lens 240 has a bottom surface 243 facing toward the bottom plate 212. A transparent conductive oxide (TCO) 244 is located on the bottom surface 243 of the lens 240, and may be formed by physical vapor deposition (PVD). In this embodiment, the transparent conductive oxide 244 can be referred to as a second conductive path. The second conductive path 244 is distributed over the entire bottom surface 243 of the lens 240 and above the accommodating space S1. The second conductive path 244 is electrically connected to the first conductive path 220. The lens 240 may a light diffusing type lens. For example, the bottom surface 243 of the lens 240 may has microstructures 246 through an etch process (e.g., hard film printing). The lens 240 can diffuse the light (e.g., a laser) of the light-emitting element 250 out of the optical module 200 through the microstructures 246, thereby preventing the light with excessive energy from directly irradiating human eyes to cause injury. The microstructures 246 of FIG. 12 are used as an example, and the present disclosure is not limited to the shape and the arrangement of the microstructures 246. Alternatively, in another embodiment, the lens 240 may have microstructures through nanoimprinting.

Besides the first end 222 of the first conductive path 220, the first conductive path 220 further has a second end 224 on a bottom surface 213 of the first support element 210. When the optical module 200 for protecting human eyes is used in an electronic device (e.g., a mobile phone), a sensing unit may be disposed in the electronic device to electrically connect the second end 224 of the first conductive path 220 to detect the resistance difference of the second conductive path 244 on the lens 240. When the lens 240 is hit by an external force or other factors to be broken or separated from the first support element 210, the sensing unit may detect a resistance difference of the second conductive path 244 on the lens 240 through the first conductive paths 220, and then sends a signal to a power unit for the light-emitting element 250 to switch the light-emitting element 250 off. Since the light of the light-emitting element 250 passing through a broken lens or no lens has excessive energy, the light would cause injury to human eyes. Accordingly, the optical module 200 for protecting human eyes can prevent the light of the light-emitting element 250 from passing through the broken lens or no lens to directly enter human eyes, thereby preventing injury to human eyes.

In this embodiment, the number of the openings O1 of the metal bonding layer 230 and the number of the first conductive paths 220 are two, but the present disclosure is not limited in this regard. For example, the number of the openings O1 of the metal bonding layer 230 and the number of the first conductive paths 220 may be four, such that the optical module 200 for protecting human eyes utilizes four points to detect the resistance difference of the second conductive path 244 on the lens 240 to improve accuracy.

As long as the first end 222 and the second end 224 of the first conductive path 220 can be respectively exposed from the top surface 215 of the sidewall 214 and the bottom surface 213 of the bottom plate 212, the first conductive path 220 may extend in the sidewall 214 and the bottom plate 212 of the first support element 210, and may have turning points in the first support element 210 as deemed necessary by designers. The formation, material, and advantages of the first support element 210 may be similar to that of the aforementioned first support element 210 of FIG. 4, and will not be described again.

In this embodiment, the sidewall 214 of the first support element 210 may further have an extending portion 217 that abuts a lateral surface of the lens 240. Such a design can prevent the lens 240 from shifting in a horizontal direction, thereby improving the stability of the lens 240.

The optical module 200 for protecting human eyes may further include a heat dissipation structure 270 and electrodes 280a and 280b. The bottom plate 212 of the first support element 210 may pass through the heat dissipation structure 270, and the light-emitting element 250 is located on the heat dissipation structure 270. The electrodes 280a and 280b are located on the bottom plate 212 of the first support element 210, and the electrodes 280a and 280b are electrically connected to the light-emitting element 250 respectively through conductive wires 252a and 252b. The heat dissipation structure 270 may be metal so as to have electric conductivity. The heat dissipation structure 270 may be used as an electrode of the light-emitting element 250. In this embodiment, the electrodes 280a and 280b may be used as anodes, and the heat dissipation structure 270 may be used as a cathode, but the present disclosure is not limited in this regard.

It is to be noted that the connection relationships and materials of the elements described above will not be repeated in the following description. In the following description, other types of optical modules for protecting human eyes will be described.

Figure 13:
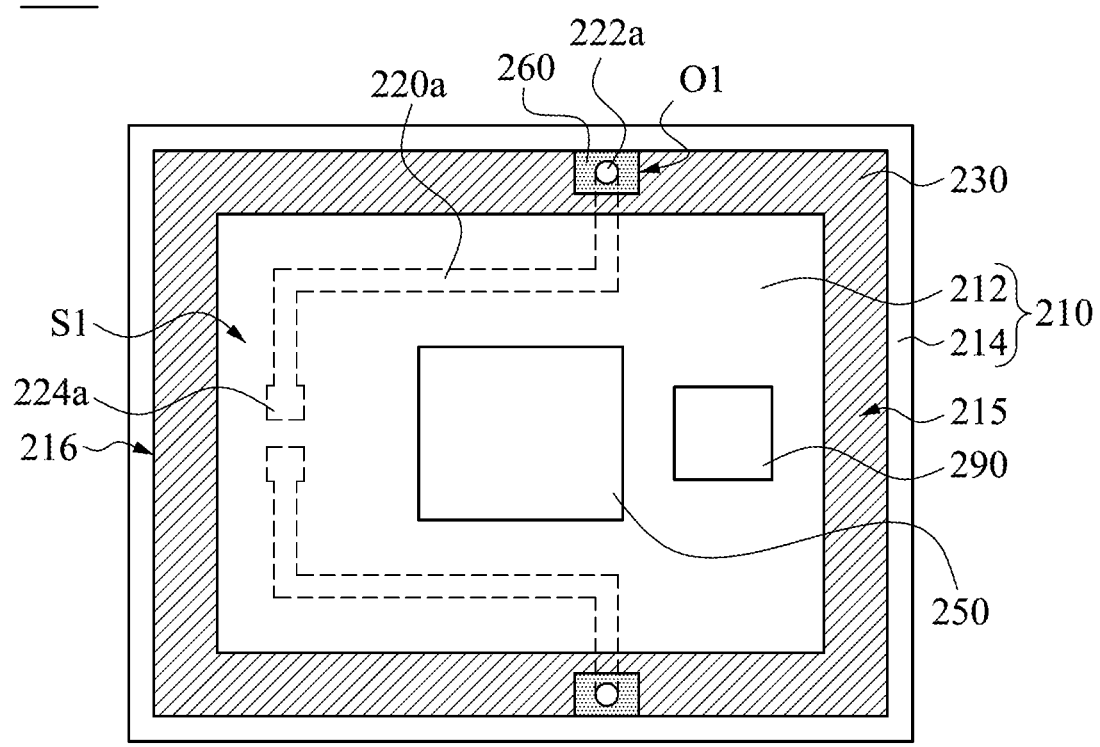
FIG. 13 is a top view of an optical module for protecting human eyes according to one embodiment of the present disclosure when a lens is removed.

FIG. 13 is a top view of an optical module 200a for protecting human eyes according to one embodiment of the present disclosure when the lens 240 (see FIG. 9) is removed. The optical module 200a includes the first support element 210, first conductive paths 220a, the metal bonding layer 230, the light-emitting element 250, and the isolation layer 260. The first conductive path 220a has a first end 222a on the top surface 215 of the sidewall 214 and a second end 224a that is on the bottom surface 213 (see FIG. 12) of the bottom plate 212. The difference between this embodiment and the embodiment shown in FIG. 10 is that the trace design of the first conductive path 220a and an added light sensor 290.

In this embodiment, the first conductive path 220a extends from the sidewall 214 of the first support element 210 to the bottom plate 212, and has turning points in the bottom plate 212. The trace of the first conductive path 220a in the first support element 210 may be modified by designers in accordance with practical requirements, such that the second end 224a of the first conductive path 220a is exposed from another position of the bottom plate 212 of the first support element 210.

In addition, in this embodiment, the optical module 200a further includes the light sensor 290 on the bottom plate 212 of the first support element 210. When the lens 240 (see FIG. 9) is disposed on the metal bonding layer 230 and the light-emitting element 250 is on, the light sensor 290 may detect light reflected by the lens 240, and thus the light sensor 290 is used as an auxiliary component capable of determining whether the lens 240 is broken or not.

Figure 14:
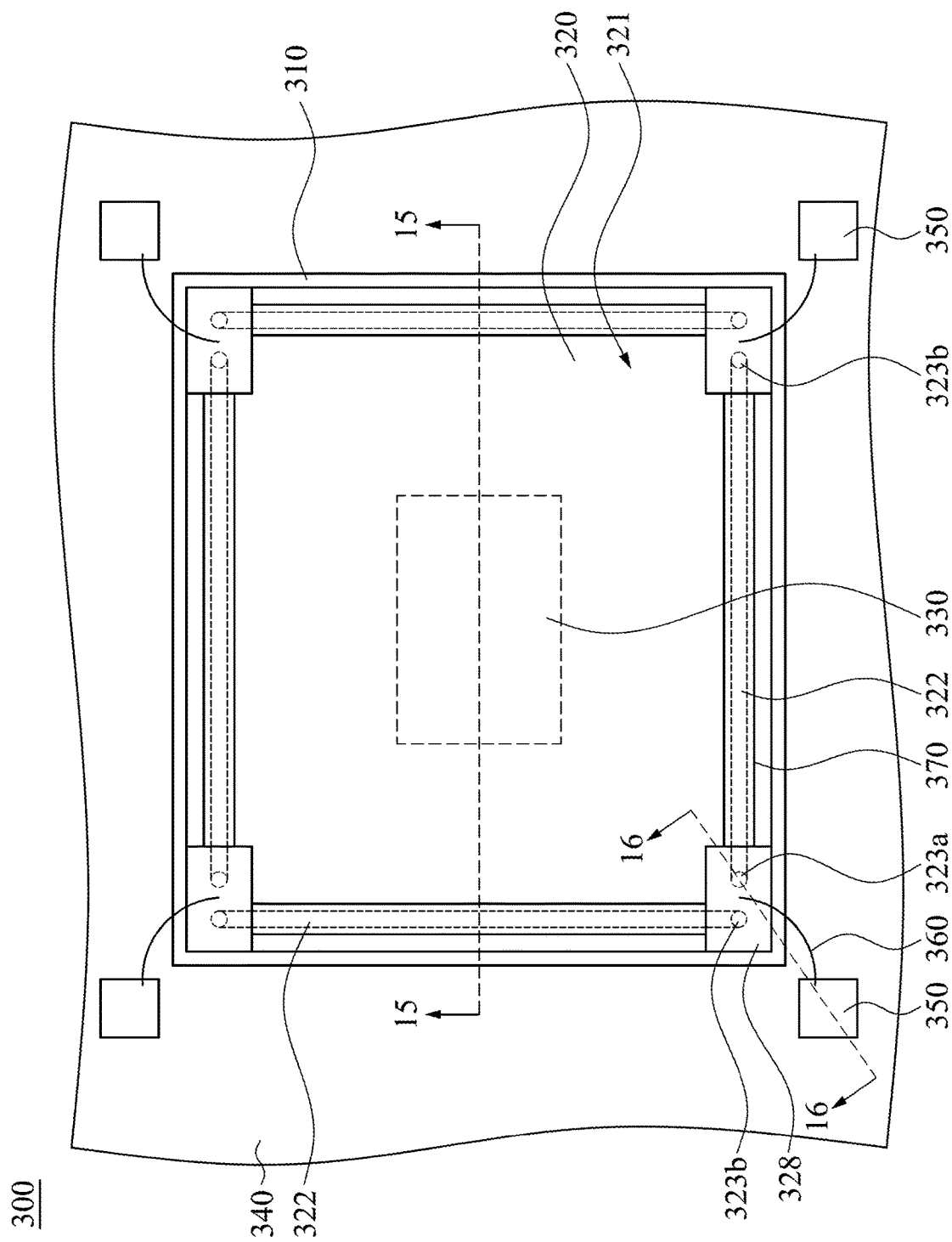
FIG. 14 is a top view of an optical module for protecting human eyes according to one embodiment of the present disclosure.
Figure 15:
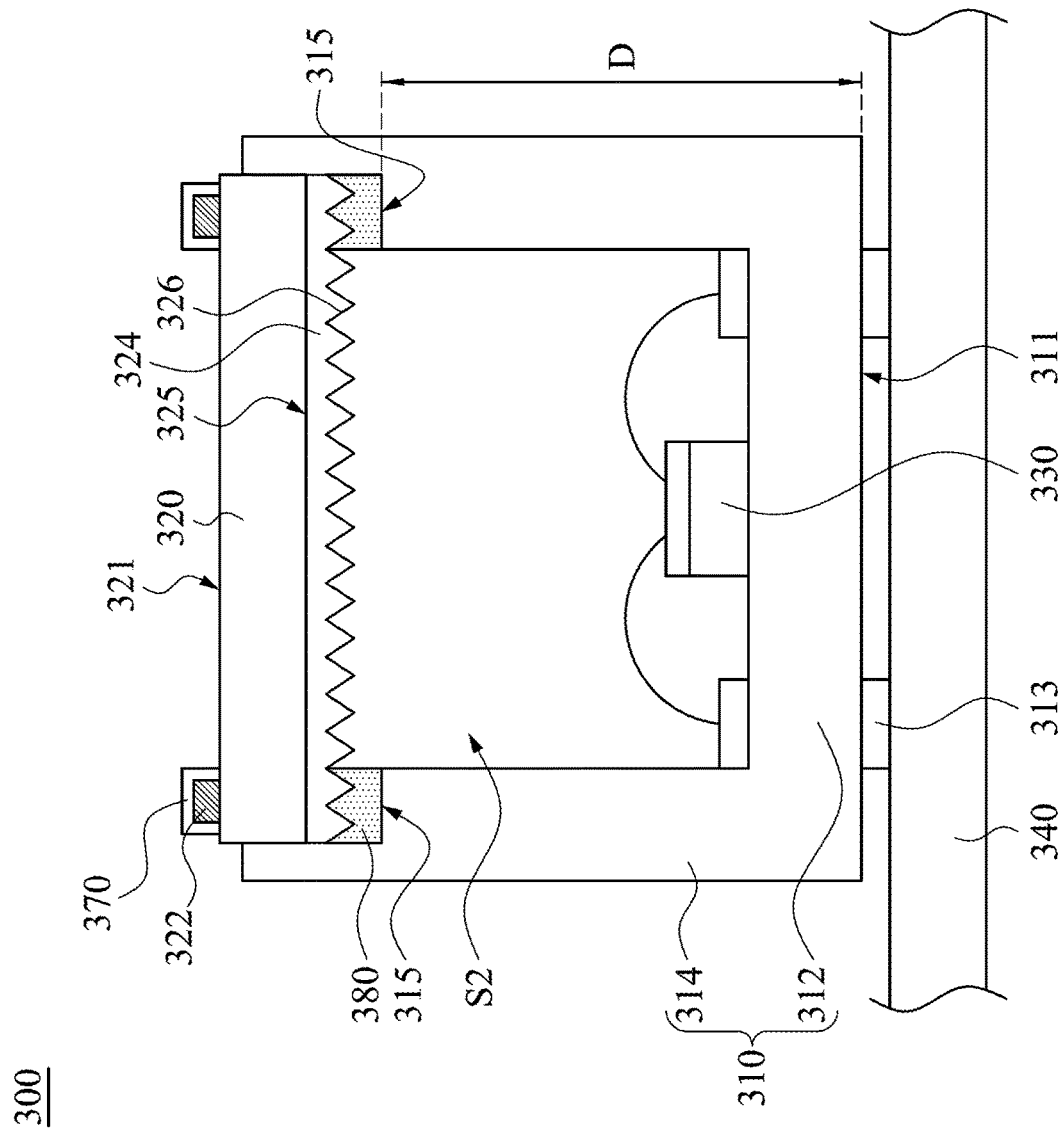
FIG. 15 is a cross-sectional view of the optical module for protecting human eyes taken along line 15-15 shown in FIG. 14.

FIG. 14 is a top view of an optical module 300 for protecting human eyes according to one embodiment of the present disclosure. FIG. 15 is a cross-sectional view of the optical module 300 for protecting human eyes taken along line 15-15 shown in FIG. 14. As shown in FIG. 14 and FIG. 15, the optical module 300 includes a first support element 310, first conductive paths 350, a lens 320 having second conductive paths 322, a light-emitting element 330, and a second support element 340. The first support element 310 has a bottom plate 312 and a sidewall 314 on the bottom plate 312, and the sidewall 314 surrounds an accommodating space S2. The first conductive paths 350 are outside the first support element 310. The lens 320 is located on a top surface 315 of the sidewall 314. The lens 320 is located on the top surface 315 of the sidewall 314, and has a top surface 321 facing away from the top surface 315 of the sidewall 314. The top surface 321 of the lens 320 has the second conductive paths 322 that surround the accommodating space S2. Two ends 323a and 323b of each of the second conductive paths 322 are respectively on two corners of the top surface 321 of the lens 320. The light-emitting element 330 is located on the bottom plate 312 of the first support element 310. The second support element 340 supports the first support element 310.

In this embodiment, the optical module 300 may be used in a diffraction optical component, such as a dot projector, and thus a distance between the lens 320 and the light-emitting element 330 is greater than a distance between the lens 140 and the light-emitting element 150 of FIG. 12. For example, the first support element 310 has a bottom surface 311 facing away from the lens 320, and a distance D between the bottom surface 311 and the top surface 315 of the sidewall 314 is in a range from 2 mm to 10 mm. The first support element 310 may be made of a material including ceramic or epoxy molding compound (EMC), but the present disclosure is not limited in this regard.

In addition, the bottom surface 311 of the first support element 310 may further have electrodes 313 electrically connected to the light-emitting element 330.

Figure 16:
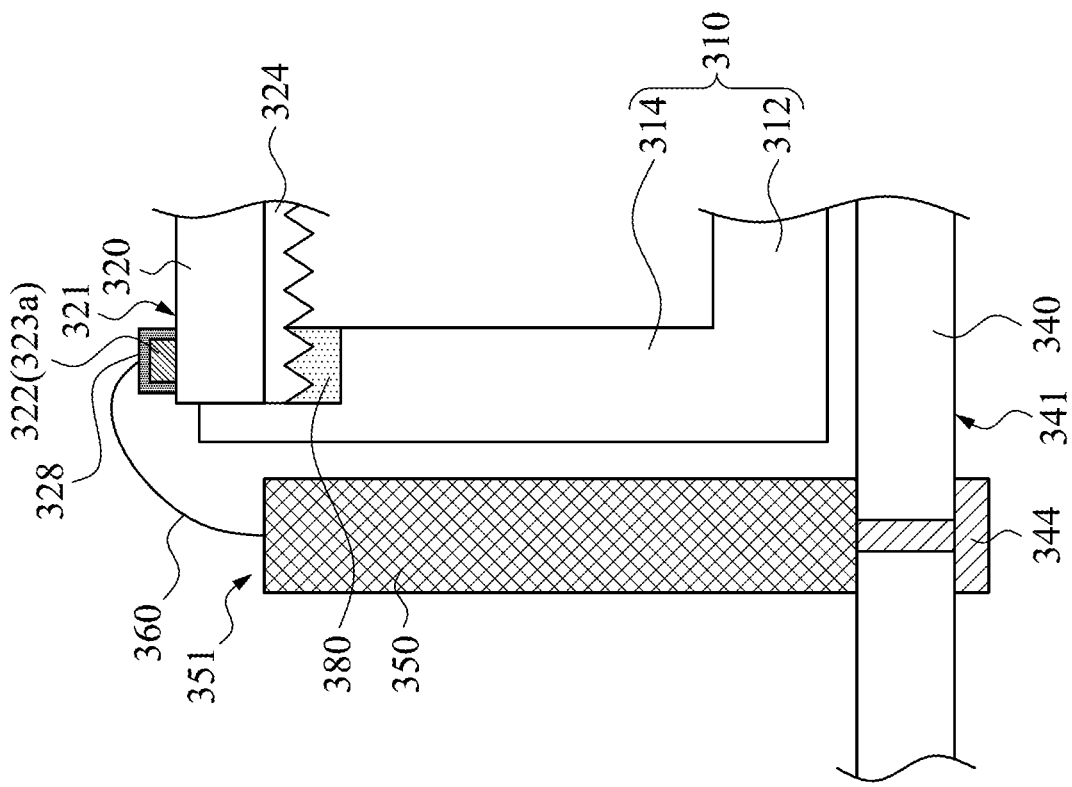
FIG. 16 is a cross-sectional view of the optical module for protecting human eyes taken along line 16-16 shown in FIG. 14.

FIG. 16 is a cross-sectional view of the optical module 300 for protecting human eyes taken along line 16-16 shown in FIG. 14. As shown in FIG. 14 and FIG. 16, the first conductive path 350 is located on the second support element 340, and the first conductive path 350 is electrically connected to the end 323a of the second conductive path 322. Although FIG. 16 merely shows the first conductive path 350 is electrically connected to the end 323a of the second conductive path 322, the other end 323b of the second conductive path 322 is also electrically connected to another first conductive path 350 is electrically connected to the end 323a of the second conductive path 322 in accordance with the lower right side of FIG. 14. In the following description, the end 323a of the second conductive path 322 and the first conductive path 350 electrically connected with each other are used as an example.

In this embodiment, the first conductive path 350 is a conductive pillar, and is substantially perpendicular to the second support element 340. An end 351 of the first conductive path 350 facing away from the second support element 340 is adjacent to the end 323a of the second conductive path 322. Moreover, the optical module 300 further includes a conductive pad 328 and a conductive wire 360. The conductive pad 328 is on the end 323a of the second conductive path 322 and the end 323b of another adjacent second conductive path 322. Two ends of the conductive wire 360 is respectively located on the conductive pad 328 and the end 351 of the first conductive path 350, which may be manufactured by wire bonding. The second support element 340 has a bottom surface 341 facing away from the first support element 310, and the bottom surface 341 has a contact 344 electrically connected to the first conductive path 350. When the optical module 300 for protecting human eyes is used in an electronic device (e.g., a mobile phone), a sensing unit may be disposed in the electronic device to electrically connect to the contact 344 to detect the resistance difference of the second conductive path 322 of the lens 320.

Since the top surface 321 of the lens 320 has the second conductive path 322, and the first conductive path 350 is located on the second support element 340 that carries the first support element 310, the first conductive path 350 can be electrically connected to the second conductive path 322 through the conductive wire 360. If the lens 320 is far from the light-emitting element 330 so as to need a high first support element 310, the height of first conductive paths 350 can be increased without affecting the manufacture of the first support element 310, such that the first support element 310 may be easily demolded to reduce cost. The second conductive path 322 is electrically connected to the first conductive paths 350 and the second conductive path 322 itself may serve as a resistance. Therefore, when the lens 320 is hit by an external force or other factors to be broken or separated from the first support element 310, a sensing unit may detect a resistance difference through the first and second conductive paths 322 and 322, and then sends a signal to a power unit that is electrically connected to the electrodes 313 (see FIG. 15) to switch the light-emitting element 350 off. Since the light of the light-emitting element 330 passing through a broken lens or no lens has excessive energy, the light would cause injury to human eyes. Accordingly, the optical module 300 for protecting human eyes can prevent the light of the light-emitting element 330 from directly entering human eyes, thereby preventing injury to human eyes.

In this embodiment, the lens 320 may be a quadrilateral (e.g., a rectangle) when viewed from above, and thus has four sides. The number of the second conductive paths 322 is four, and the four second conductive paths 322 have eight ends 323a and 323b. The number of the first conductive paths 350 is four, and each of the four first conductive paths 350 is adjacent to one of the corners of the lens 320, such that the four first conductive paths 350 can be conveniently, respectively, and electrically connected to the four conductive pads 328 on the eight ends 323a and 323b of the four second conductive paths 322. The optical module 300 for protecting human eyes utilizes eight points to detect the resistance difference of the second conductive paths 322 on the lens 320, thereby improving accuracy.

In this embodiment, the lens 320 may further include isolation layers 370 on the second conductive paths 322. The ends 323a and 323b of the second conductive path 322 extend outward from the isolation layer 370. In other words, the isolation layer 370 does not cover the ends 323a and 323b of the second conductive path 322. The isolation layers 370 may provide protection and isolation to the second conductive paths 322. The isolation layer 370 may be made of a material including silicon dioxide or silicon nitride, and the second conductive path 322 may be made of a material including indium tin oxide (ITO), but the present disclosure is not limited in this regard. In addition, the ends 323a and 323b of the second conductive path 322 extending outward from the isolation layer 370. Further, the conductive pad 328 including Cr/Au alloy, Ni/Au alloy, Cr/Al alloy, or Cr/Ti alloy may be disposed on the ends 323a and 323b of the second conductive path 322 that extend outward from the isolation layer 370 for the convenience of wire bonding.

As shown in FIG. 15, the lens 320 has a bottom surface 325 facing toward the top surface 315 of the sidewall 314. The bottom surface 325 has an imprinting layer 324 that has microstructures 326. The microstructures 326 of FIG. 15 are used as an example, and the present disclosure is not limited to the shape and the arrangement of the microstructures 326. The optical module 300 for protecting human eyes further includes an adhesive layer 380 between the lens 320 and the top surface 315 of the sidewall 314. Such a configuration can solve the problem about the imprinting layer 324 which cannot withstand a high temperature.

Figure 17:
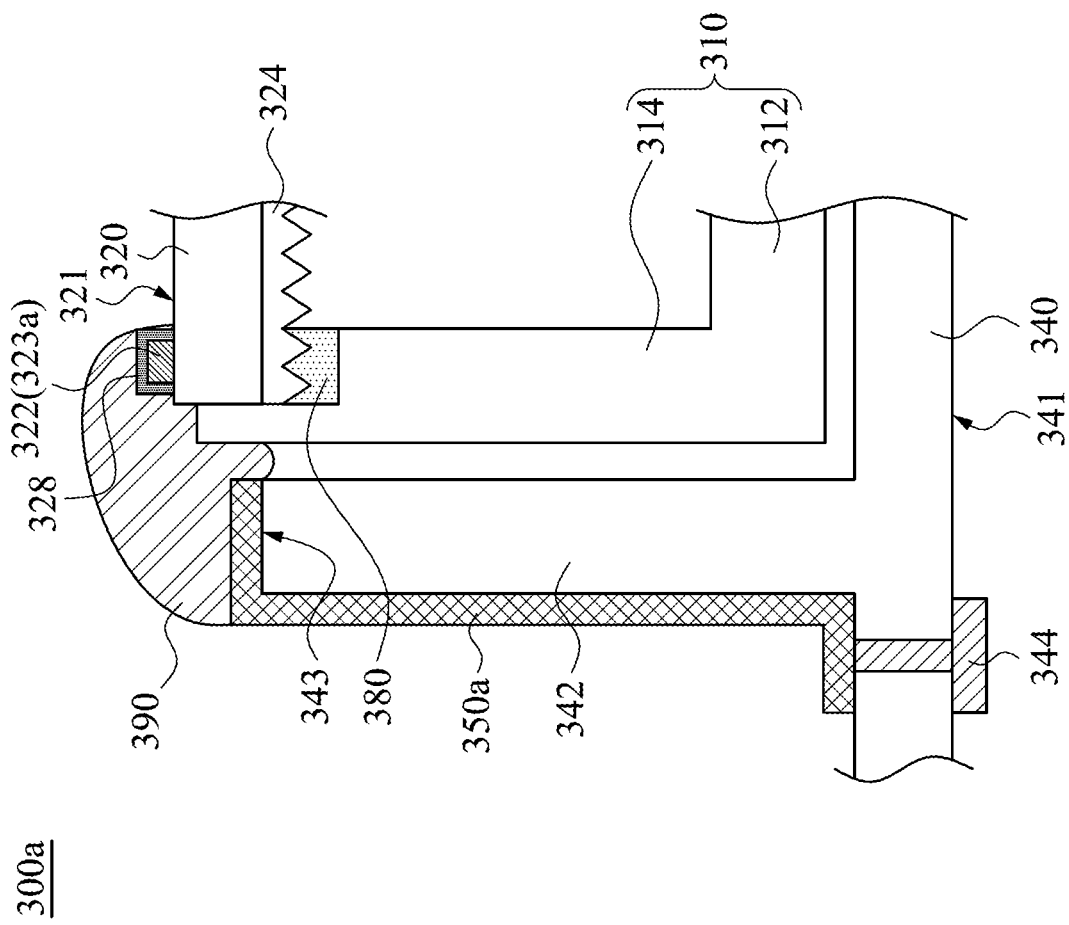
FIG. 17 is a cross-sectional view of an optical module for protecting human eyes according to one embodiment of the present disclosure, in which the cross-sectional position is the same as in FIG. 16.

In alternative embodiments, the conductive wire 360 of FIG. 16 can be placed with conductive paste 390 shown in FIG. 17, such that the conductive paste 390 is located on the conductive pad 328 and the end 351 of the first conductive path 350 (i.e., the conductive pillar).

It is to be noted that the connection relationships and materials of the elements described above will not be repeated in the following description. In the following description, other types of optical modules for protecting human eyes will be described.

FIG. 17 is a cross-sectional view of an optical module 300a for protecting human eyes according to one embodiment of the present disclosure, in which the cross-sectional position is the same as in FIG. 16. The optical module 300a for protecting human eyes includes the first support element 310, a first conductive paths 350a, the lens 320 having the second conductive path 322, the light-emitting element 330 (see FIG. 15), and the second support element 340. The difference between this embodiment and the embodiment shown in FIG. 16 is that the second support element 340 has a protruding portion 342, and the first conductive path 350a is a conductive layer, and the optical module 300a further includes the conductive pad 328 and conductive paste 390. In this embodiment, a top surface 343 of the protruding portion 342 of the second support element 340 is adjacent to the end 323a of the second conductive path 322. The first conductive path 350a is located on the protruding portion 342 and extends to the top surface 343 of the protruding portion 342. Moreover, the conductive pad 328 is on the end 323a of the second conductive path 322 and the end 323b of another adjacent second conductive path 322 (see FIG. 14). The conductive paste 390 on the conductive pad 328 and the first conductive path 350a that is on the top surface 343 of the protruding portion 342 of the conductive pad 328.

When the optical module 300a for protecting human eyes is used in an electronic device (e.g., a mobile phone), a sensing unit may be disposed in the electronic device to electrically connect to the contact 344 to detect the resistance difference of the second conductive path 322 on the lens 320. Since the top surface 321 of the lens 320 has the second conductive path 322, and the first conductive path 350a is located on the second support element 340 that carries the first support element 310, the first conductive path 350a can be electrically connected to the second conductive path 322 through the conductive paste 390. If the lens 320 is far from the light-emitting element 330 so as to need a high first support element 310, the height of first conductive paths 350a can be increased without affecting the manufacture of the first support element 310, such that the first support element 310 may be easily demolded to reduce cost.

In alternative embodiments, the conductive paste 390 of FIG. 17 can be placed with the conductive wire 360 shown in FIG. 16, such that two ends of the conductive wire 360 are respectively located on the conductive pad 328 and the first conductive paths 350a (i.e., the conductive layer) on the top surface 343 of the protruding portion 342.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the invention. In view of the foregoing, it is intended that the present disclosure covers modifications and variations of this invention provided they fall within the scope of the following claims.

What is claimed is:

1. An optical module for protecting human eyes, comprising:
   a first support element having a bottom plate and a sidewall on the bottom plate, wherein an accommodating space is surrounded by the sidewall;
   a plurality of first conductive paths in the first support element, wherein each of the first conductive paths has a first end and a second end, the first end is adjacent to a top surface of the sidewall, and the second end is adjacent to the bottom plate;
   a lens above the accommodating space and located on the top surface of the sidewall;
   a metal bonding layer bonding between the top surface of the sidewall and the lens, and having a plurality of openings, wherein positions of the openings are respectively correspond to positions of the first ends of the first conductive paths, and the lens is located on the metal bonding layer;
   at least one second conductive path on the lens and electrically connected to the first ends of the first conductive paths; and
   a light-emitting element located on the bottom plate of the first support element, wherein when a resistance difference is detected through the first and second conductive paths, the light-emitting element is switched off.

2. The optical module of claim 1, wherein a plurality of the second conductive paths are located on the lens and surround the accommodating space, and two ends of each of the second conductive paths are respectively electrically connected to two of the first ends of the first conductive paths.

3. The optical module of claim 1, wherein the lens and the sidewall are quadrilaterals, and have four sides, and each of the number of the second conductive paths, the number of the openings, and the number of the first conductive paths is four, and the four second conductive paths are respectively located on the four sides of the lens, and the four first ends of the four first conductive paths are respectively located on four corners of the top surface of the sidewall.

4. The optical module of claim 1, further comprising:
   an isolation layer between the second conductive path and metal bonding layer.

5. The optical module of claim 1 further comprising:
   an isolation layer surrounding the first ends of the first conductive paths.

6. The optical module of claim 5, wherein the isolation layer is among the first ends of the first conductive paths, the metal bonding layer, the lens, and the top surface of the sidewall.

7. The optical module of claim 1, wherein the lens and the sidewall are quadrilaterals, and have four sides, and the number of the second conductive paths is two, and each of the number of the openings and the number of the first conductive paths is four, and one of the two second conductive paths is below and electrically isolated from the other second conductive path, and each of the two second conductive paths has a quadrilateral structure that surrounds the accommodating space, and the four first ends of the four first conductive paths are respectively located on four corners of the top surface of the sidewall.

8. The optical module of claim 7, further comprising:
   two isolation layers, wherein one of the two isolation layers is between the two second conductive paths, and the underlying second conductive path is between the two isolation layers.

9. The optical module of claim 1, wherein the lens has a bottom surface and a gold plating layer, the gold plating layer is located on the bottom surface and in contact with the metal bonding layer, and the bottom surface and the gold plating layer face the first support element.

10. The optical module of claim 1, wherein a surface of the lens facing toward the first support element has an imprinting layer that has a plurality of microstructures.

11. The optical module of claim 1, further comprising:
    an adhesive layer located between the lens and the top surface of the sidewall.

12. The optical module of claim 1, wherein the second conductive path is distributed over an entire bottom surface of the lens.

* * * * *